(12) United States Patent
Wagner

(10) Patent No.: US 7,774,395 B2
(45) Date of Patent: Aug. 10, 2010

(54) DIGITAL FILTER FOR TRANSMISSION-END PULSE SHAPING

(75) Inventor: Elmar Wagner, Duisburg (DE)

(73) Assignee: Infineon Technologies AG, Neubiberg (DE)

( * ) Notice: Subject to any disclaimer, the term of this patent is extended or adjusted under 35 U.S.C. 154(b) by 1242 days.

(21) Appl. No.: 11/217,938

(22) Filed: Sep. 1, 2005

(65) Prior Publication Data

US 2006/0053187 A1    Mar. 9, 2006

(30) Foreign Application Priority Data

Sep. 1, 2004   (DE) .................. 10 2004 042 368

(51) Int. Cl.
*G06F 17/10*  (2006.01)
(52) U.S. Cl. .................................... 708/319
(58) Field of Classification Search .............. 708/319
See application file for complete search history.

(56) References Cited

U.S. PATENT DOCUMENTS

| | | | | |
|---|---|---|---|---|
| 5,778,029 A | * | 7/1998 | Kaufmann | 375/296 |
| 5,870,431 A | * | 2/1999 | Easton et al. | 375/230 |
| 5,930,299 A | * | 7/1999 | Vannatta et al. | 375/269 |
| 5,966,314 A | * | 10/1999 | Lee | 708/319 |
| 2002/0118739 A1 | | 8/2002 | Schier et al. | 375/229 |
| 2002/0131487 A1 | | 9/2002 | Butler et al. | 375/229 |
| 2002/0150147 A1 | | 10/2002 | Liang | 375/133 |

FOREIGN PATENT DOCUMENTS

EP      0 940 956 A2    8/1999

OTHER PUBLICATIONS

Gentile, Ken; The Care and Feeding of Digital Pulse-Shaping Filters; RF Design; pp. 50-58, Apr. 2004.
Bluetooth Specification Version 1.2 with EDR (vol. 2), Chapter 3.2, pp. 36-41, Appendix C, pp. 53-56, May 2004.
Zhu, W. -P. et al., "ASIC Implementation Architecture for Pulse Shaping FIR Filters in 3G Mobile Communications," IEEE, vol. 1, pp. I-433-I436 (2002).

* cited by examiner

*Primary Examiner*—Tan V Mai
(74) *Attorney, Agent, or Firm*—Dicke, Billig & Czaja, PLLC

(57) ABSTRACT

The digital filter has a finite impulse response, whose length corresponds at most to the duration of N input values, with the filter emitting an output signal which is n-times oversampled in comparison to the input signal (I, Q). In this case, a device (38.1-38.5) for storage of a plurality of N look-up tables is provided in the filter. n data values are stored per value in each look-up table for a plurality of k possible values of the input signal. Each data value is in this case characteristic of the product of a coefficient of the impulse response and a value of the input signal (I, Q).

24 Claims, 4 Drawing Sheets

DIGITAL FILTER FOR TRANSMISSION-END PULSE SHAPING

CROSS-REFERENCE TO RELATED APPLICATIONS

This application claims priority to German Patent Application No. 10 2004 042 368.7, which was filed on Sep. 1, 2004, and is incorporated herein by reference in its entirety.

TECHNICAL FIELD

The invention relates to a digital filter, in particular for transmission-impulse shaping, and to a corresponding filter method.

BACKGROUND

Bits or symbols are transmitted in the form of pulses in digital communication systems. Pulse shaping filters are used in order to limit the bandwidth required for the transmission of the pulses. One typical representative of this class of filters is the so-called raised cosine pulse shaping filter. The name of the filter is derived from the profile of the transfer function. If separate transmission and reception filters are used rather than a transmission-end raised cosine pulse shaping filter, these are based on so-called root raised cosine filters. In this case, the square of the transfer function of a root raise cosine filter corresponds to the transfer function of a raised cosine filter. More detailed information relating to pulse shaping filters can be found in the article "The care and feeding of digital, pulse-shaping-filters" by Ken Gentile, RF Design, April 2004.

For modern radio systems with high data transmission rates, the use of pulse shaping filters is advisable in order to reduce the required transmission bandwidth, owing to the limited overall transmission capacity of the transmission medium. High data transmission rates are made possible, for example, by the use of 4-value or 8-value modulation methods. The enhanced Bluetooth 1.2 Standard with EDR (enhanced data rate) uses $\pi/4$-DQPSK or 8 DPSK modulation (differential (quadrature) phase shift keying) for increased data transmission rates of 2 Mb/s and 3 Mb/s, with $\pi/4$-DQPSK representing a 4-value type of modulation, and 8 DPSK modulation representing an 8-value type of modulation.

With modulation methods such as these, 1d(M) bits of the datastream to be transmitted are mapped onto a complex symbol, depending on the significance M of the modulation method, and this is also referred to as symbol mapping. A complex symbol such as this in this case forms a point on the unit circle with a real part and an imaginary part. In this case, the real part corresponds to the in-phase component (I component for short), and the imaginary part corresponds to the quadrature component (Q component for short). The subsequent pulse shaping, in particular by means of two root raised cosine filters, is carried out generally separately in two paths for the I component and the Q component. In general, an increase in the sampling rate, with, for example, double, quadruple or octuple oversampling is carried out before the actual pulse shaping filter. Such a sampling rate increase can be achieved by repetition of the sample value. The need for a sampling rate increase is justified because the Nyquist condition means that the cut-off frequency of the transfer function is limited to half the sampling rate. If the cut-off frequency of the transfer function is, for example, the same as the symbol rate $f_s$, at least double oversampling is required.

Pulse shaping filters are generally in the form of digital FIR filters. The expression FIR (finite impulse response) indicates that the impulse response has a finite length. FIR filters known from the prior art are based on digital adders, digital multipliers and delay elements. FIGS. 1a and 1b show two alternative embodiments of FIR filters. According to the first embodiment shown in FIG. 1a, an input signal X is delayed by a chain of N'−1 delay elements. The chain comprises N' signal taps, with the signal being multiplied at each signal tap by a coefficient $\alpha_i$—where i=1, 2, ..., N'—of the impulse response by means of a multiplier. The multiplied signals are added in N'−1 adders. Alternatively, the addition operations and the delay operations can be interchanged, thus resulting in the implementation of an FIR filter as illustrated in FIG. 1b. The fact that two different embodiments are feasible is justified by the fact that the convolution is a commutative operation.

SUMMARY

A disadvantage of one implementation of an FIR pulse shaping filter, in particular of a root raise cosine pulse shaping filter, in the manner illustrated in FIG. 1a or 1b is that the oversampling means that a large number of adders, multipliers and delay elements are required. If, by way of example, a filter memory of 5 symbols and octuple oversampling are provided, that is to say 8 sample values per symbol, then N'=40 multipliers are required, as well as in each case N'−1=39 adders and delay elements. This is associated with an area requirement which should not be underestimated on a monolithically integrated transmission module, and in the high filter power consumption. The area required and the power loss are in this case governed primarily by the number of digital multipliers.

On the basis of the above statements, it can be understood that the number of taps in a pulse shaping filter such as this can be reduced if the sampling rate of the filter input signal is reduced. Filter approaches are thus known which operate with less oversampling, (for example double oversampling), with an additional interpolation filter being provided, which retrospectively increases the sampling rate. Approaches such as these have the disadvantage that the downstream interpolation filter once again results in an additional area requirement, and in an additional power consumption.

One object of the invention is thus to specify a digital filter concept, in particular for transmission-end pulse shaping, which requires less circuitry complexity and results in reduced power loss consumption in comparison to solutions known from the prior art.

The object on which the invention is based can be achieved by a digital filter having a finite impulse response, with the length of the impulse response corresponding at most to the duration of N input values, wherein the digital filter receives a digital filter input signal and emits a filter output signal, which is n-times oversampled in comparison to the filter input signal, and wherein the digital filter comprises a means for storage of a plurality N of look-up tables, with n data values being stored per value in each look-up table for a plurality of k possible values of the filter input signal, and each data value being characteristic for the product of a coefficient of the impulse response and a value of the input signal or a value which is dependent on this value of the input signal, wherein the output signal is formed from the data values.

The object can also be achieved by an I/Q modulator, comprising a first filter for pulse shaping of signals in the I path of the I/Q modulator, and a second filter for pulse shaping of signals in the Q path of the I/Q modulator, wherein the first and second filter each are digital filters having a finite impulse response, with the length of the impulse response corresponding at most to the duration of N input values, wherein each digital filter receives a digital filter input signal and emits a filter output signal, which is n-times oversampled in comparison to the filter input signal, and each filter comprises a means for storage of a plurality N of look-up tables, with n data values being stored per value in each look-up table for a plurality of k possible values of the filter input signal, and each data value being characteristic for the product of a coefficient of the impulse response and a value of the input signal or a value which is dependent on this value of the input signal, wherein the output signal is formed from the data values.

The object can furthermore be achieved by a filter method having a finite impulse response, with the length of the impulse response corresponding at most to the duration of N input values, the method comprising the steps of emitting a filter output signal for a digital filter input signal, which filter output signal is n-times oversampled in comparison to the filter input signal, and reading out a plurality of N stored look-up tables for filtering the digital filter input signal, with n data values being stored per value in each look-up table for a plurality of k possible values of the filter input signal, and each data value being characteristic for the product of a coefficient of the impulse response and a value of the input signal or a value which is dependent on this value of the input signal, and forming the output signal from the data values.

The digital filter according to the invention has a finite impulse response whose length corresponds at most to the duration of N input values (or, see below, n–N output values). One major feature of the filter according to the invention is that it receives a digital filter input signal and emits a filter output signal which is n-times oversampled in comparison to the filter input signal, that is to say oversampling is carried out in the filter itself. In this case, the filter has a means for storage of a plurality of N look-up tables, that is to say the number of look-up tables corresponds to the input-related length of the impulse response.

n data values are stored per value in each look-up table for a plurality of k possible values of the filter input signal. In this case, it is not absolutely essential to store in each case n data values for the total number k'>k possible values of the input signal. Each data value is characteristic for one product of a coefficient of the impulse response and the value of the input signal. Alternatively, it is also possible to provide for a value which is dependent on the value of the input signal, rather than the input signal itself, to be used to form the basic multiplier for a product such as this. The output signal form the filter is formed from the data values.

The filter according to the invention is based on the following discoveries:

1. In many applications, the number of possible input values of a digital filter is small. This applies in particular to pulse shaping filters. For example, in the case of π/4-DQPSK or 8 DPSK modulation, only 8 complex symbol values, that is to say points on the unit circle, are possible, so that the I symbol component in the Q symbol component can each have only 5 different values, specifically the values $-1, -\sqrt{2}, 0, +1$ and $+\sqrt{2}$. With such a small number of input values, there is no need to provide a digital filter based on flexible multipliers, which multiply the filter input values by the coefficients of the impulse response and at the same time could process any desired filter input values. Instead of this, the calculated products for a small number of input values can just be stored in a look-up table. In this case, there is no need for digital multipliers, thus considerably reducing the circuit complexity and the power losses.

2. Frequently—as described above—the sampling rate is increased before the actual filtering process, so that the sample rate in a pulse-shaping filter such as this is higher than the symbol rate. In this case, with the conventional filter approaches, it is necessary to provide a number of multipliers, adders and delay elements multiplied by the factor of the increase in the sampling rate. If, for example, the length of the impulse response is N symbols, then a greater number of multipliers is required in the event of a sampling rate increase by the factor n, that is to say in total $N'=n \cdot N$ multipliers. If, in contrast, the sampling rate increase and the filtering are combined, then a single sample value of the filter input signal calls up n data values. This measure in principles reduces the number of multipliers in comparison to FIR filters known from the prior art by the factor n, since only one filter input value is processed per symbol, instead of n filter input values.

The discoveries from the considerations described in paragraphs 1 and 2 are used in a combined manner in the filter according to the invention:

As discussed in paragraph 1, the filter according to the invention on the one hand in general provides a means for storage N look-up tables, instead of multipliers. The products which are otherwise calculated with the aid of multipliers are just stored as precalculated data values in the N look-up tables. In this case, a single data value corresponds to the product of a coefficient $\alpha_i$ of the impulse response and of one possible input value. When the number of possible input values is small, this measure is associated with a considerable reduction in the circuit complexity and in the power loss consumption.

Furthermore, n data values are stored for one input value in each look-up table, so that the filter operation and the sampling rate increase by the factor n are combined. However, this also means that the total number N of look-up tables is less by the factor n than the total number $N'=n \cdot N$ of multipliers in the prior art. The total number N of look-up tables thus corresponds directly to the maximum length of the impulse response, related to the filter input. Thus, in general, the filter according to the invention requires only the $(N'-1)/n$ delay elements and adders instead of $N'-1$ delay elements and adders, as in the prior art.

It should be noted that the length of the impulse response of a filter such as this corresponds at most to the duration of N input signal values or n·N output signal values. It is thus possible for the impulse response to also be shorter than the duration of N input signal values or n·N output signal values. In this case, some stored data values, in particular in the last look-up table of the N look-up tables, are set to 0, since the associated coefficients of the impulse response are zero.

The design of the filter according to the invention can easily be explained with the aid of a numerical example: if, for example, the length of the impulse response corresponds to the duration of N=5 input values, that is to say in the case of a pulse shaping filter, to the duration of 5 symbols, then the filter according to the invention has N=5 look-up tables. If, furthermore, the aim is to achieve an output-side sampling rate increase of n=8, then in principle each look-up table in each case has n=8 data value for each possible input value, that is to say for example $-1, -\sqrt{2}, 0, +1$ and $+\sqrt{2}$ for the 5 values, that is to say 40 data values for 5 possible input values. In comparison to this, the implementation of the filter according to the prior art requires $N'=n \cdot N=8 \cdot 5=40$ multipliers, that is to say 40 taps. In addition, separate sampling rate increase is required before the actual filter in the prior art, and the implementation of the filter according to the invention avoids this.

However, for the filter according to the invention, it is also possible to provide for data values to be stored for a total of k<k' possible input values rather than in each case storing n data values for the total number k' of all possible input values in each look-up table. For example, rather than storing corresponding data values for all 5 values $-1, -\sqrt{2}, 0, +1$ and $+\sqrt{2}$, corresponding data values are stored only for the 4 values $-1, -\sqrt{2}, +1$ and $+\sqrt{2}$. This reduces the amount of memory required and is possible because the product of an input value of 0 and any given coefficient of the impulse response is generally 0, and can thus be ignored.

The filter advantageously receives as the input signal the I or Q component of a signal, in particular for the situation in which the filter is a transmission-end pulse shaping filter or a reception filter. In this case, by way of example, 5 possible values $-1, -\sqrt{2}, 0, +1$ and $+\sqrt{2}$ can be represented by 5 different input words, with 3 bits with little circuit complexity, in which case the input signal will be a word with a length of 3 bits. A word with the length of 3 bits is thus allocated to each of the values $-1, -\sqrt{2}, 0, +1$ and $+\sqrt{2}$. In this case, the resolution of the input signal does not correspond to the resolution which would be necessary for indication of the values $-1, -\sqrt{2}, 0, +1$ and $+\sqrt{2}$ on which the multiplication is actually based (for example 8 bits). The advantage of representing the values in this way is that the filter according to the invention can be provided in the input area and the driving circuit can be produced in a simpler form, since the number of bits is considerably reduced. Only ceil(1d(k')) bits are required to represent k' different values, with this function ceil(i) describing the smallest natural number greater than i. ceil(1d(5))≈ceil(2.23)=3 bits are therefore required for 5 values.

The stored data values each correspond to a product of a value of the I or Q component and a coefficient of the impulse response. In this case, it is necessary to ensure that a value of the I or Q component with correspondingly high resolution is advantageously used as the basis for the product.

The representation of a plurality of values, as described above, using only ceil(1d(k')) bits need not necessarily relate to the I or Q component of a signal, but can also be transferred in a general form to other applications.

Furthermore, in the case of the filter according to the invention, it is not essential for the input values of the filter to correspond directly to the basic values of the multipliers for the stored products. It is sufficient for the stored data values to in each case be characteristic for the product of a coefficient of the impulse response and a value which is dependent on the value of the input signal. For this purpose, it is feasible for the filter according to the invention also to carry out the symbol mapping. In this case, the filter does not just receive as an input signal the I or Q components, but an appropriately parallelized data stream prior to symbol mapping. The symbol mapping, that is to say the association of values of the data stream with the symbols, in particular with their I or Q component, can in this case be included in the look-up table itself.

Corresponding to the number of look-up tables, the digital filter advantageously has N paths, with the input of each of the N paths being driven in a similar way to a conventional FIR filter by the filter input signal or by a delayed filter input signal. In this case, each of the N paths has a memory element for storage of one of the N look-up tables. The N paths of a filter designed in this way in this case correspond to the taps, as illustrated in FIG. 1a and FIG. 1b, of the FIR filters, with memory elements for storage of the look-up tables being provided instead of the multipliers N.

In this case, each of the N memory elements advantageously has one address input, which is driven as a function of the filter input signal (possibly in delayed form). Furthermore, each of the N memory elements has one output for emitting the stored data values as a function of the signal at the address input. In particular, one data value is emitted at the output of the respective memory element for each signal value at the address input.

The memory elements as described above, which each have one address input and one output for emitting the data values, allow the look-up tables to be produced in a simple form. One address signal is generated as a function of the filter input (possibly in delayed form). In this case, the address input is not necessarily connected to the input of the filter; for example, a circuit element may be produced at the input of each path, and initially generates address values from the signal values applied there. In particular, it is possible to provide for n and only n address values to be generated for each sample value at the input of a path corresponding to the selected sampling rate increase, with each of the address values being associated with one, and only one, data value.

For this purpose, the filter according to the invention advantageously contains at least one counter with n counts for driving the address input. In this case, it is feasible to use one counter in each case for each path, or to use just one counter for address generation in all the paths. The counter can thus be used to ensure that n and only n address values are generated for each sample value at the input of a path, corresponding to the sampling rate increase.

In this case, a circuit element for address generation is advantageously provided in each path. The circuit element maps the respective tuple comprising the respective value of the input signal of the path, and the respective count onto one of k·n addresses. The variable k describes the number of possible values of the filter input signal for which data values are stored in the memory elements. Thus, for example, if each memory element contains n=8 data values for the k=4 values $-1, -\sqrt{2}, +1$ and $+\sqrt{2}$, then, in a corresponding manner, k·n=32 addresses are generated.

The filter advantageously has a means for successive application of the value of the filter input signal to each individual input of the N paths. The successive application is in this case carried out in time with the filter input signal, that is to say at the symbol clock rate in the case of a pulse shaping filter.

For a pulse shaping filter, this means that one value of the I or Q symbol components is initially applied to the input of the first of N paths, so that n data values are read from the look-up table in the first path, determining the first n output values of the output signal in time. The same value of the signal component is supplied one symbol clock cycle later to the second path, so that n data values are read from the look-up table in the second path, and govern the subsequent output values in time. This process is continued until even the last of the N look-up tables has been read from. In this case, it is necessary to ensure that there is not just one input value in the filter, but that input values are read continuously into the filter, so that, for example, the m-th of the N look-up tables is read as a function of the next symbol value in time, while the (m−1)-th of the N look-up tables is read at the same time as a function of a previous symbol value in time. The output signals of all N paths are then advantageously superimposed by means of an appropriate means in order to generate the filter output signal.

It is advantageous for the means for successive application of the value of the filter input signal to have a chain of N−1 delay elements, which is driven by the input signal. In this case, the input of the first delay means is electrically connected to the input of the first of the N paths, and the output of each of the other N−1 delay means is electrically connected to in case one input of the other N−1 paths. An embodiment of the filter according to the invention such as this is analogous to the embodiment of the FIR filter illustrated in FIG. 1a. Alternatively, it would also be feasible, as shown in FIG. 1b, to shift the output signals from the N storage means in time with respect to one another, by appropriate delay means. The advantage of the first-mentioned alternative is, however, that the input-side delay means can be implemented with less circuit complexity when the input signal has a small number of bits, (for example 3 bits) than output-related delay means (in this case, typically, 8 bits or more in order to ensure adequate signal resolution). A further advantage of the first-mentioned alternative over the second-mentioned alternative is also that the number of delay elements required is reduced by the factor of the sampling rate increase n, since the output signals from the look-up tables are at a sampling rate that has been increased n-times.

Only data values relating to values of the filter input signal other than 0 are advantageously stored in the look-up tables. In this case, each path advantageously has a circuit means which can decouple the output of a memory element from the output of the path. The decoupling should be carried out when the value of the signal at the input of the respective path corresponds to the value 0. In this case, it should be noted that the word '000' need not necessarily by applied, by virtue of an appropriate representation for a zero value. In this case, a zero value is advantageously generated at the output of the path.

The filter according to the invention is advantageously based on a root raised cosine transfer function. As already described above with reference to the prior art, a transfer function such as this is particularly suitable for pulse shaping. In general, the filter according to the invention can also be used to produce all the other transfer functions which can also be produced using a convention FIR filter. For example, this includes a Gaussian filter for GFSK modulation (Gaussian frequency shift keying).

The I/Q modulator according to the invention has a first filter according to the invention for the pulse shaping of the signals in the I path of the I/Q modulator, as well as a second filter according to the invention, for pulse shaping of signals in the Q path of the I/Q modulator.

The above statements relating to the filter according to the invention apply in a corresponding manner to the filter method according to the invention.

BRIEF DESCRIPTION OF THE DRAWINGS

The invention will be explained in more detail in the following text using one exemplary embodiment and with reference to the drawings, in which.

DETAILED DESCRIPTION

Figure 1A:
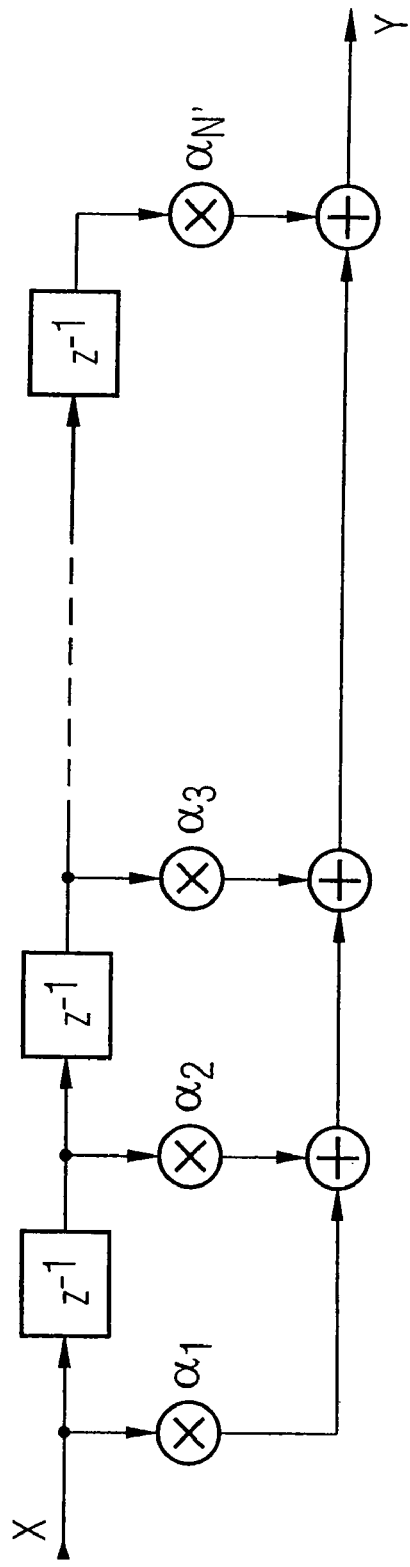
FIG. 1a shows an FIR filter with an input-side delay according to the prior art.
Figure 1B:
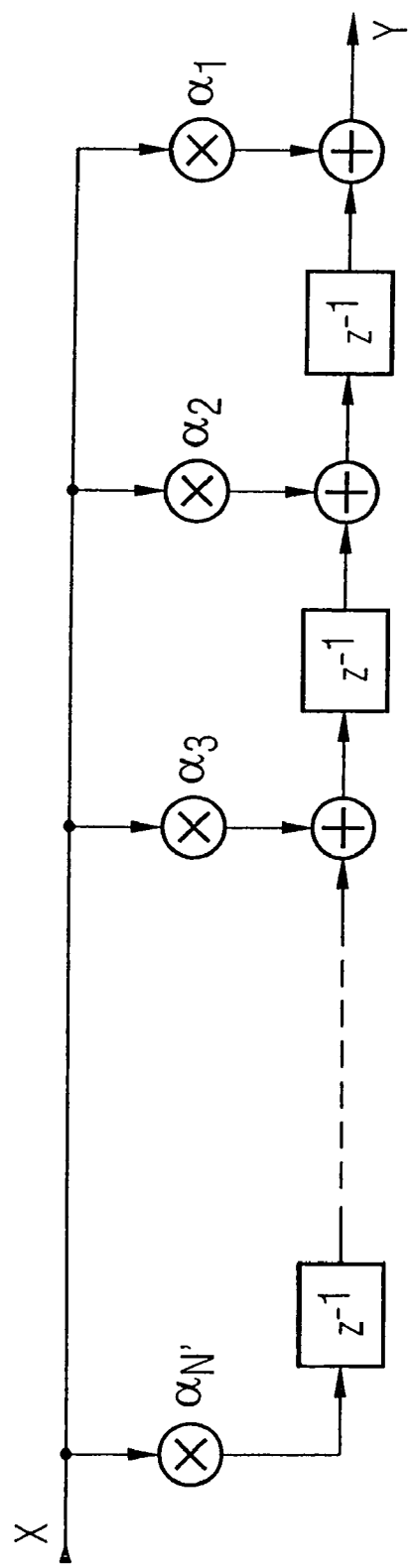
FIG. 1b shows an FIR filter with an output-side delay according to the prior art.

Reference should be made to the above statements relating to the embodiments of FIR filters which are known from the prior art and are illustrated in FIG. 1a and FIG. 1b.

The exemplary embodiment of the digital filter according to the invention as described in the following text is intended for use in a Bluetooth transmitter with the Bluetooth transmitter operating in accordance with the enhanced Bluetooth 1.2 Standard with EDR (enhanced data rate), or in accordance with the high-rate Bluetooth Standard. As already mentioned above, enhanced data transmission rates of 2 Mb/s and 3 Mb/s are provided in the first-mentioned standard by means of π/4-DQPSK and 8 DPSK modulation, respectively.

In addition, the conventional data rate of 1 Mb/s, based on a binary GFSK modulation, is supported. The high-rate Bluetooth Standard provides π/4-DQPSK and 8 DPSK modulation, with the symbol rate being higher by a factor of 4 than the first-mentioned Standard.

In the differential π/4 DQPSK modulation method, 2 bits of the serial data stream to be transmitted are mapped onto a complex symbol, while in the case of the differential 8 DPSK modulation method, 3 bits are mapped onto a complex symbol. The possible symbol values are in this case located on the unit circle. With differential modulation methods such as these, the symbol value $S_k$ at the time k is dependent on the symbol value $S_{k-1}$ at the time k−1 in accordance with the following equation:

$$S_k = S_{k-1} \cdot e^{j\phi_k} \tag{1}$$

The symbol $S_k$ is thus obtained by a rotation of the previous symbol $S_{k-1}$ through the angle $\rho_k$.

Table 1 shows the association between 2 successive bits $b_{2k-1}$ and $b_{2k}$ in the data stream, and the phase shift $\rho_k$ for π/4-DQPSK modulation, while Table 2 shows the association between 3 successive bits $b_{3k-2}$, $b_{3k-1}$ and $b_{3k}$ in the data stream and the phase shift $\rho_k$ for 8 DPSK modulation.

TABLE 1

| $b_{2k-1}$ | $b_{2k}$ | $\rho_k$ |
|---|---|---|
| 0 | 0 | π/4 |
| 0 | 1 | 3π/4 |
| 1 | 1 | −3π/4 |
| 1 | 0 | −π/4 |

TABLE 2

| $b_{3k-2}$ | $b_{3k-1}$ | $b_{3k}$ | $\rho_k$ |
|---|---|---|---|
| 0 | 0 | 0 | 0 |
| 0 | 0 | 1 | π/4 |
| 0 | 1 | 1 | π/2 |
| 0 | 1 | 0 | 3π/4 |
| 1 | 1 | 0 | π |
| 1 | 1 | 1 | −3π/4 |
| 1 | 0 | 1 | −π/2 |
| 1 | 0 | 0 | −π/4 |

Figure 2:
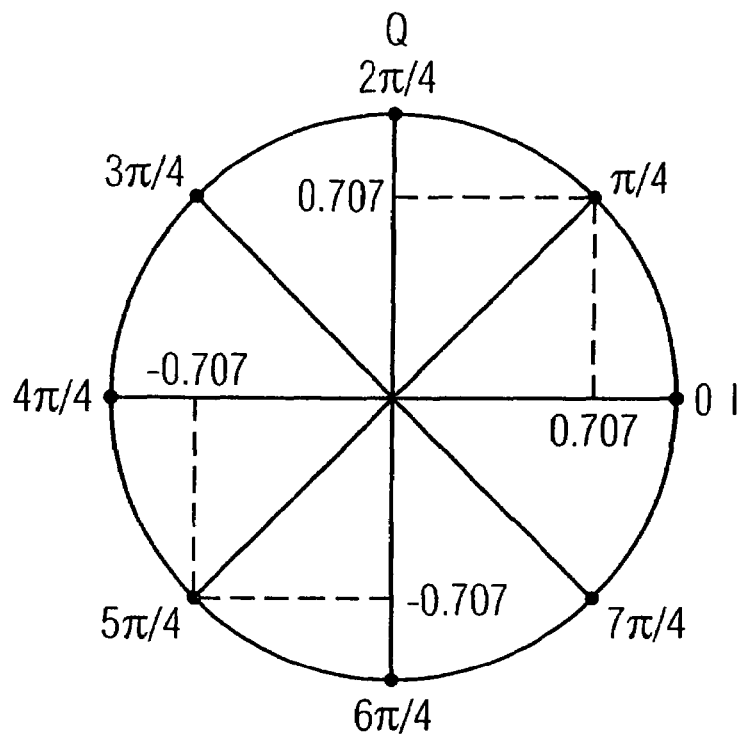
FIG. 2 shows an illustration of the complex symbol values for the 8 DPSK or π/4 DQPSK modulation method.

FIG. 2 shows the complex 8 symbol values $S_k$ which result with the 8 DPSK or π/4-DQPSK method on the unit circle (each marked by a dot). In this case, both the I and the Q component have 5 possible values: −1, −√2, 0, +1 and +√2.

Figure 3:
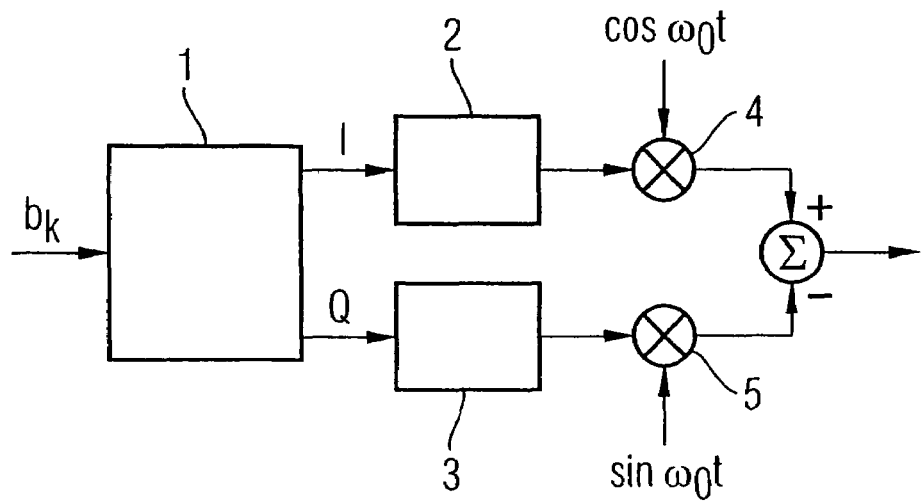
FIG. 3 shows an outline circuit diagram of an I/Q modulator for the 8 DPSK and/or π/4 DQPSK modulation method.

FIG. 3 shows the basic configuration of a transmission-end I/Q modulator for the 8 DPSK and/or π/4-DQPSK method. A symbol mapper 1 produces the association, as explained above, between the bits and the serial data stream $b_k$ and the symbols $S_k$. In order to emit the complex symbols $S_k$, the symbol mapper 1 provides 2 outputs, with the first output producing the in-phase component I and the second output produces the quadrature component Q of the respective complex symbol $S_k$. As already described above, the respective 5 possible values of the in-phase component I or quadrature component Q can be coded using 3 bits in each case. The band widths of the signals I and Q are reduced by means of two separate pulse shaping filters 2 and 3. A sampling rate increase is normally provided before the actual filtering in the prior art. If the pulse shaping filters 2 and 3 are implemented in the manner according to the invention, there is no need for a separate sampling rate increase, since the sampling rate increase is carried out in the pulse shaping filters 2 and 3, respectively, according to the invention. The correspondingly filtered symbol components are mixed, after digital-analogue conversion (not illustrated), by means of the mixers 4 and 5 onto the carrier frequency $f_0=\omega_0/2\pi$, and are then superimposed.

The enhanced Bluetooth 1.2 Standard with EDR provides for the pulse shaping filters 2 and 3 each to be in the form of root raised cosine filters.

The magnitude of the transfer function of a root raised cosine filter such as this is given by:

$$|P(f)| = \begin{cases} 1 & \text{for } 0 \le |f| \le (1-\beta) \cdot \frac{f_s}{2} \\ \sqrt{\frac{1}{2}\left(1 - \sin\left(\pi \frac{(2fT_s - 1)}{2\beta}\right)\right)} & \text{for } (1-\beta) \cdot \frac{f_s}{2} \le |f| \le (1+\beta) \cdot \frac{f_s}{2} \\ 0 & \text{else} \end{cases} \quad (2)$$

In this case, $f_s=1$ Msymbols/s describes the symbol frequency, and $T_s=1/f_s=1$ μs describes the symbol time duration. The variable $\beta$ indicates the so-called roll-off factor, and may be in the range between 0 and 1. The enhanced Bluetooth 1.2 Standard with EDR provides a roll-off factor $\beta$ of 0.4.

Figure 4A:
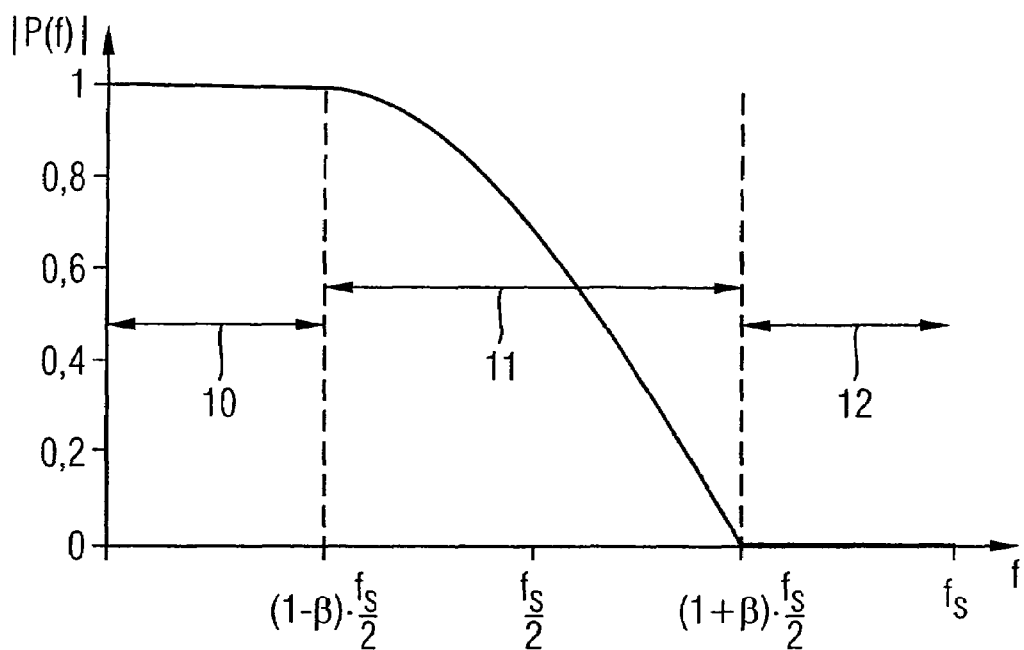
FIG. 4a shows the profile of the magnitude of the transfer function of a root raised cosine filter.

FIG. 4a shows the profile of the magnitude of the transfer function of a root raised cosine filter as a function of the frequency f. As can also be seen in equation 2, the profile can in this case be subdivided into three regions 10, 11 and 12. The region boundaries can be shifted by the choice of the roll-off factor $\beta$, so that the profile in the region 11 is very steep when the values of $\beta$ are high, while the profile is very flat when the values of $\beta$ are low. In accordance with the Nyquist criterion, oversampling by a factor of at least 2 should be used for the implementation of root raised cosine filters such as this.

Figure 4B:
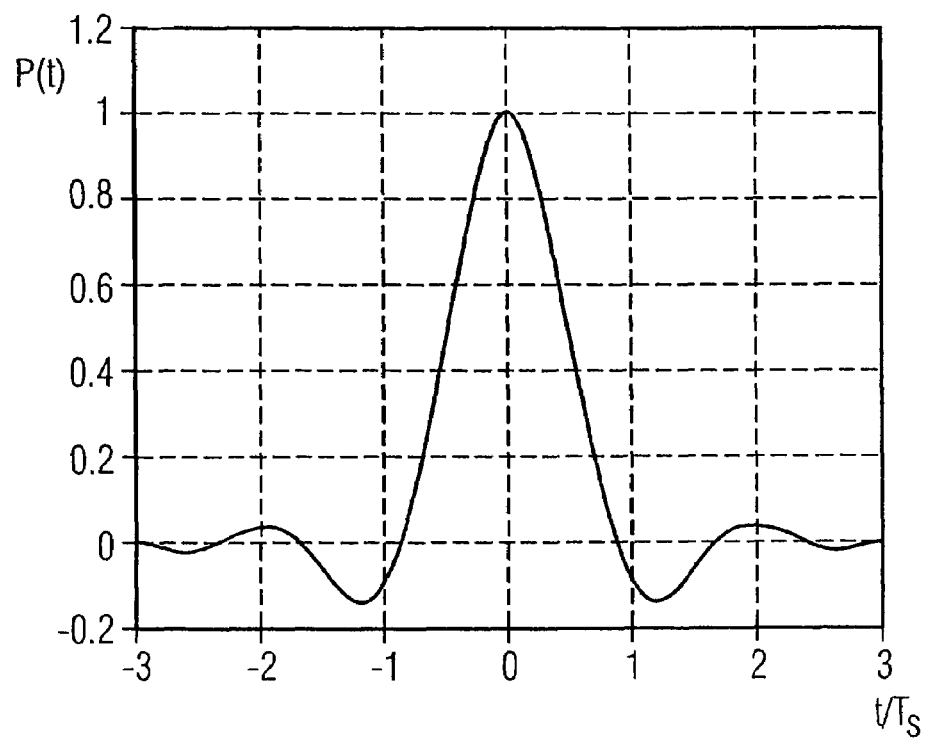
FIG. 4b shows the profile of the impulse response of a root raised cosine filter.
Figure 5:
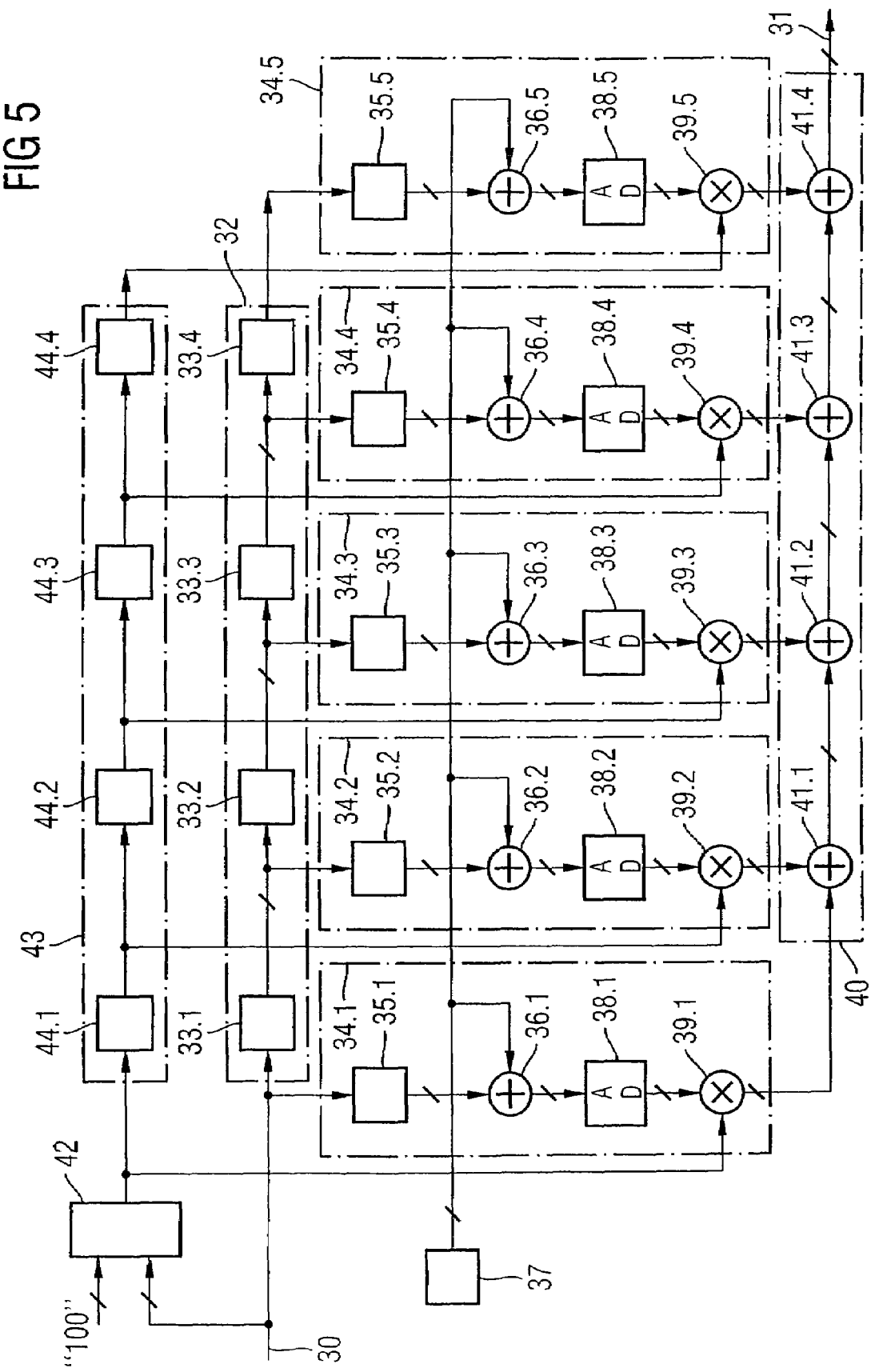
FIG. 5 shows one exemplary embodiment of the digital filter according to the invention.

FIG. 4b shows the profile of the impulse response of a root raised cosine filter with a roll-off factor of 0.5. As can be seen, the profile does not have a zero crossing at the times $t=i \cdot T_s$ where i −2, −1, 1 and 2, so that filtered successive pulses in time would interfere at the sampling times, which is also referred to as ISI (intersymbol interference). However, since, in principle, 2 such filters are provided in the transmission path, this results in the transfer function having a profile which has a zero crossing and each of the times $t=i \cdot T_s$ where i=−2, −1, 1 and 2.

More extensive statements relating to the modulation methods used in the Bluetooth 1.2 Standard with EDR and relating to the pulse shaping provided there can be found in the Bluetooth documents "Bluetooth-Specification Version 1.2 with EDR [Vol 2]", Chapter 3.2, pages 36 to 41.

FIG. 3 shows one exemplary embodiment of a digital pulse shaping filter 2 or 3, respectively, according to the invention for a symbol rate $f_s$ of 1 Msymbols/s. In the exemplary embodiment according to the invention, the number of look-up tables is chosen to be N=5, so that the maximum length of the impulse response corresponds to the duration of 5 input values. Furthermore, the filter is used to increase the sampling rate by the factor of n=8, so that the maximum length of the impulse response at the filter output corresponds to n·N=8·5=40 output values. The total k' of possible values of the input signal is 5, with data values being stored in the look-up tables for only k=4 values. The remaining fifth value in this case corresponds to the value 0, in which the output of the look-up tables is in each case decoupled from the filter output for this value.

The filter has a filter input 30 for reception of the in-phase or quadrature component I or Q, respectively (see FIG. 3), and a filter output 31 for emission of the respectively filtered symbol component. In this case, the input has a bus length of only 3 bits in order to represent 5 different values, while the bus length of the output is 8 bits. However, an output bus length of less than 8 bits is in fact sufficient for many other applications, while there are also applications which require more than 8 bits. A chain 32 of (N−1)=4 delay element 33.1-33.4 is provided on the input side. The delay duration of one such delay element 33.1-33.4 is one symbol clock period $T_s$. Furthermore, 5 paths 34.1-34.5 are provided at the inputs of the delay elements 33.1-33.4 and at the output of the last delay element 33.4.

Each path 34.1-34.5 has a bit shifting means 35.1-35.5 on the input side. Furthermore, each path 34.1-34.5 contains a respective adder 36.1-36.5, which adds the output signal from the respective bit shifting means 35.1-35.5 to the output signal of a counter 37. Furthermore, each path has a memory element 38.1-38.5, whose address input A is driven by the respective output of the corresponding adder 36.1-36.5. One of 5 look-up tables is stored in each memory element. A respective multiplier 39.1-39.5 is provided at the data output D of each memory element 38.1-38.5, and whose output signal forms the respective output signal of the respective path 34.1-34.5. The output signals of the paths 34.1-34.5 are superimposed by means of a chain 40 of N−1=4 adders 41.1-41.4, so that the filtered and oversampled signal is obtained at the filter output 31 by means of the superimposition.

A value of the I or Q symbol component at the filter input 30 is first of all applied to the input of the first path 34.1, so that n data values are read from the look-up table in the first path, and govern the first n output values of the signal in time at the filter output 31. The same value of the symbol component is supplied one symbol clock period $T_s$ later to the second path 34.2, so that n data values are read from the look-up table in the second path 34.2 and govern the subsequent output values in time. This is continued until the look-up table in the last path 34.5 has also been read. In this case, it is necessary to ensure that there is not just one input value in the filter, but that input values are read continuously to the filter, so that the m-th of the 5 look-up tables is read, for example, as a function of a subsequent symbol value in time, while the (m−1)-th of the 5 look-up tables is read at the same time, as a function of a previous input value in time.

Furthermore, a comparator 42 is provided at the input 30 of the filter and in each case compares the signal I or Q at the filter input 30, which has a length of 3 bits, with the digital word "100", which has a length of 3 bits, in each case. The word "100" which has a length of 3 bits, in this case represents the value 0. The comparator 42 is used to check whether the value 0 (represented digitally by "100") is present at the filter input 30. If this is the case, the comparator produces the logic value 0, otherwise it produces the logic value 1. The output signal from the comparator 42 is delayed via a chain 43 of (N−1)=4 delay elements 44.1-44.4 (for example in the form of D flipflops). The delay duration of the delay elements 44.1-44.4 corresponds to the symbol clock period $T_s$. The output signal from the comparator 42 and the delay signals which are produced at the output of the delay element 44.1-44.4 are supplied to the second input of the respective multipliers 39.1-39.5.

If the comparator 42 finds that the value 0 is present at the filter input 30 (corresponding to the binary word "100"), a logic 0 is produced at the output of the comparator 42, so that the output of the multiplier 39.1 and, subsequently at the symbol clock rate $f_s$, the outputs of the multipliers 39.2-39.5 are at the value 0 (for example represented by the binary word "00000000") irrespective of the output value of the respective memory element 38.1-38.5. The output of the respective memory element 38.1-38.5 effectively has the value 0 overwritten on it by means of the respective multiplier 39.1-39.5, as soon as a zero is present at the input of the path 34.1-34.5. Since the respective multipliers 39.1-39.5 multiply only the output signal of the respective memory element 38.1-38.5 by a logic 0 or a logic 1, the multipliers 39.1-39.5 may be in the form of simplified multipliers, which either allow the output signals from the memory elements 38.1-38.5 pass through unchanged (multiplication by 1), or set the output side to the value 0 (multiplication by 0). In the case of these simplified multipliers 39.1-39.5, the signals on the individual output lines of the memory elements 38.1-38.5 are logically linked, bit-by-bit, via AND gates with the output signal from the comparator 42 and with the delayed output signal from the comparator 42.

In order to produce the respective address signals for the memory element 38.1-38.5, the respective signal is first of all shifted to the left by ceil(ld(n))=3 bit positions by means of a bit shifting means 35.1-35.5 at the start of a path 34.1-34.5. By way of example, a digital multiplier can be provided for this purpose, carrying out a multiplication operation by the value 8 in digital form. By way of example, the word "011000" is thus generated from the word "011". The three least significant bit positions in the shifted word are governed by the count of the counter 37. The counter counts continuously from 0 (which corresponds to the word "000") to n−1 (which corresponds to the word "111"), with the output values of the counter changing with the clock rate n·$f_s$. This means that n=8 addresses are generated in each symbol clock rate $T_s$ in each path as a function of the signal at the respective input of that path. Instead of a logic bit-shifting means and adder, the function of these two elements can also be carried out by means of appropriate wiring of the bit lines. In this case, the signal for the address input A is generated in such a way that the most significant bits of the address signal, in particular the ceil(ld'(k))=2 most significant bits, correspond to the path input signal, and the least significant bits, in particular the ceil(ld(n))=3 least significant bits, correspond to the output signal for the counter 37. Furthermore, particularly in the situation in which n does not represent a power of 2, a multiplier which multiplies the path input signal by the factor n in each case can be provided in each case instead of a bit shifting means 35.1-35.5.

By way of example, Table 3 shows one example of memory occupancy of the memory elements 38.1-38.5. Each memory element has k·n=32 addresses, in which case a data value with a length of 8 bits can be stored in each case at each address. The data value in this case corresponds to the product of a coefficient of the impulse response and the respective value of the I or Q component of the input of the path. The 8-bit data values are indicated in hexadecimal form in the table. In this case, a 2's complement form is chosen for negative numbers. In this case, n=8 data values, corresponding to the increase in sampling rate, are allocated to each of the k=4 filter input values $-1$, $-\sqrt{2}$, $+1$ and $+\sqrt{2}$. If the value 0 is applied to the input of the respective path as I or Q component, then the output of the respective path is set to 0.

Furthermore, as can also be seen from Table 3, the respective three last data values relating to the k=4 filter input values form the last memory element 38.5 are set to 0 ("0x00"). This means that the impulse response has a length of only n·N−3=37 output values, since the last three data values read for the impulse response are set to 0. Theoretically, it would also be feasible for these data values with the value 0 not to have to be stored explicitly in the last memory element 38.5.

The circuit described above could be modified for the purposes of the invention by the filter according to the invention also carrying out the symbol mapping. In this case, the I or Q component would not be supplied to the filter input, but, instead of this, the filter input will be supplied with the bits $b_k$ to be transmitted in parallel form (2 bits in parallel for π/4-DQPSK modulation, and 3 bits in parallel for 8 DPSK modulation). The associations contained in Tables 1 and 2, respectively, would in this case be inherently contained in the stored look-up tables. Owing to the fact that the π/4-DQPSK modulation and 8 DPSK modulation are differential modulation methods, the choice of the data values depends not only on the signal at the input of the respective path at the time i·$T_s$, but also the signal at the time (i−1)·$T_s$. Such selection of the data values as a function of older input values would not be necessary for the additional integration of the symbol mapping when using a non-differential modulation method.

| Address | Filter input value | Memory element 38.1 | Memory element 38.2 | Memory element 38.3 | Memory element 38.4 | Memory element 38.5 |
|---|---|---|---|---|---|---|
| 1 | 1st value | 0x04 | 0xF0 | 0x55 | 0x11 | 0xFF |
| 2 | 1st value | 0x05 | 0xF2 | 0x5F | 0x02 | 0x03 |
| 3 | 1st value | 0x05 | 0xF8 | 0x62 | 0xF8 | 0x05 |
| 4 | 1st value | 0x03 | 0x02 | 0x5F | 0xF2 | 0x05 |
| 5 | 1st value | 0xFF | 0x11 | 0x55 | 0xF0 | 0x04 |
| 6 | 1st value | 0xFB | 0x22 | 0x47 | 0xF2 | 0x00 |
| 7 | 1st value | 0xF6 | 0x35 | 0x35 | 0xF6 | 0x00 |
| 8 | 1st value | 0xF2 | 0x47 | 0x22 | 0xFB | 0x00 |
| 9 | 2nd value | 0x03 | 0xF5 | 0x3C | 0x0C | 0x00 |
| 10 | 2nd value | 0x04 | 0xF6 | 0x43 | 0x02 | 0x02 |
| 11 | 2nd value | 0x03 | 0xFA | 0x46 | 0xFA | 0x03 |
| 12 | 2nd value | 0x02 | 0x02 | 0x43 | 0xF6 | 0x04 |
| 13 | 2nd value | 0x00 | 0x0C | 0x3C | 0xF5 | 0x03 |
| 14 | 2nd value | 0xFC | 0x18 | 0x32 | 0xF6 | 0x00 |
| 15 | 2nd value | 0xF9 | 0x26 | 0x26 | 0xF9 | 0x00 |

-continued

| Address | Filter input value | Memory element 38.1 | Memory element 38.2 | Memory element 38.3 | Memory element 38.4 | Memory element 38.5 |
|---|---|---|---|---|---|---|
| 16 | 2nd value | 0xF6 | 0x32 | 0x18 | 0xFC | 0x00 |
| 17 | 3rd value | 0xFD | 0x0B | 0xC4 | 0xF4 | 0x00 |
| 18 | 3rd value | 0xFC | 0x0A | 0xBD | 0xFE | 0xFE |
| 19 | 3rd value | 0xFD | 0x06 | 0xBA | 0x06 | 0xFD |
| 20 | 3rd value | 0xFE | 0xFE | 0xBD | 0x0A | 0xFC |
| 21 | 3rd value | 0x00 | 0xF4 | 0xC4 | 0x0B | 0xFD |
| 22 | 3rd value | 0x04 | 0xE8 | 0xCE | 0x0A | 0x00 |
| 23 | 3rd value | 0x07 | 0xDA | 0xDA | 0x07 | 0x00 |
| 24 | 3rd value | 0x0A | 0xCE | 0xE8 | 0x04 | 0x00 |
| 25 | 4th value | 0xFC | 0x10 | 0xAB | 0xEF | 0x01 |
| 26 | 4th value | 0xFB | 0x0E | 0xA1 | 0xFE | 0xFD |
| 27 | 4th value | 0xFB | 0x08 | 0x9E | 0x08 | 0xFB |
| 28 | 4th value | 0xFD | 0xFE | 0xA1 | 0x0E | 0xFB |
| 29 | 4th value | 0x01 | 0xEF | 0xAB | 0x10 | 0xFC |
| 30 | 4th value | 0x05 | 0xDE | 0xB9 | 0x0E | 0x00 |
| 31 | 4th value | 0x0A | 0xCB | 0xCB | 0x05 | 0x00 |
| 32 | 4th value | 0x0E | 0xB9 | 0xDE | 0x05 | 0x00 |

What is claimed is:

1. A digital filter having a finite impulse response, with the length of the impulse response corresponding at most to the duration of N input values, wherein the digital filter:
  receives a digital filter input signal and emits a filter output signal, which is n-times oversampled in comparison to the filter input signal, and
  comprises a means for storage of a plurality N of look-up tables, with n data values being stored per value in each look-up table for a plurality of k possible values of the filter input signal, and each data value being characteristic for the product of
    a coefficient of the impulse response, and
    a value of the input signal or a value which is dependent on this value of the input signal, wherein the output signal is formed from the data values
  comprises N paths, with
    the input of each of the N paths being driven by the filter input signal or by a delayed filter input signal, and
    each of the N paths in each case have a storage element for storage of one of the N look-up tables, wherein each storage element has
      an address input which is driven as a function of the filter input signal, and
      an output for emitting stored data values as a function of the signal at the address input, and
  comprises a counter with n counts for the address input drive.

2. A digital filter according to claim 1, wherein the filter is a transmission-end pulse shaping filter.

3. A digital filter according to claim 2, wherein the filter is used not only for pulse shaping but also for carrying out symbol mapping.

4. A digital filter according to claim 1, wherein the filter receives as the input signal I or Q component of a signal—in particular in the form of (ceil(1d(k')), where k' describes the total number of possible values of the filter input signal
  and each data value corresponds to the product:
    of a coefficient of the impulse response and
    of a value of I or Q component respectively.

5. A digital filter according to claim 1, wherein a division circuit is provided in each path, with the division circuit mapping the respective tuple comprising
  the respective value of the input signal of the path, and
  the respective count onto one of k·n addresses.

6. A digital filter according to claim 1, wherein the filter has a means for successive application of the value of the filter input signal to each individual input of the N paths, with the successive application being carried out in time with the filter input signal.

7. A digital filter according to claim 6, wherein the means for successive application of the value of the filter input signal has a chain, which is driven by the input signal, of N−1 delay elements, with the input of the first delay means being electrically connected to the input of the first of the N paths, and the output of each of the other N−1 delay means such that being electrically connected to a respective input of the other N−1 paths.

8. A digital filter according to claim 1, comprising a means for superimposition of the output signals from the N storage elements.

9. A digital filter according to claim 8, wherein the means for superimposition has N−1 adders.

10. A digital filter according to claim 1, wherein only data values for values of the filter input signal other than 0 are stored in the look-up tables.

11. A digital filter according to claim 1, wherein the filter is based on a root raised cosine transfer function.

12. A digital filter according to claim 1, wherein a filter input signal has only 5 different values, in particular with the filter input signal describing the I or Q signal component for PSK modulation with 8 different complex symbol values on the unit circle.

13. A digital filter having a finite impulse response, with the length of the impulse response corresponding at most to the duration of N input values, wherein the digital filter:
  receives a digital filter input signal and emits a filter output signal, which is n-times oversampled in comparison to the filter input signal, and
  comprises a means for storage of a plurality N of look-up tables, with n data values being stored per value in each look-up table for a plurality of k possible values of the filter input signal, and each data value being characteristic for the product of
    a coefficient of the impulse response, and
    a value of the input signal or a value which is dependent, on this value of the input signal, wherein the output signal is formed from the data values
  comprises N paths, with
    the input of each of the N paths being driven by the filter input signal or by a delayed filter input signal, and
    each of the N paths in each case have a storage element for storage of one of the N look-up tables, wherein each storage element has
      an address input which is driven as a function of the filter input signal, and an output for emitting stored data values as a function of the signal at the address input, wherein only data values for values of the filter input signal other than 0 are stored in the look-up tables, and wherein each path has a circuit means which decouples the output of a storage element from the output of the respective path when the value of the signal at the input of the respective path corresponds to 0.

14. An I/Q modulator, comprising
a first filter for pulse shaping of signals in the I path of the I/Q modulator, and
a second filter for pulse shaping of signals in the Q path of the I/Q modulator, wherein the first and second filter each are digital filters having a finite impulse response, with the length of the impulse response corresponding at most to the duration of N input values, wherein each digital filter:
receives a digital filter input signal and emits a filter output signal, which is n-times oversampled in comparison to the filter input signal, and
comprises a means for storage of a plurality N of look-up tables, with n data values being stored per value in each look-up table for a plurality of k possible values of the filter input signal, and each data value being characteristic for the product of
a coefficient of the impulse response and
a value of the input signal or a value which is dependent on this value of the input signal, wherein the output signal is formed from the data values
comprises N paths, with
the input of each of the N paths being driven by the filter input signal or by a delayed filter input signal, and
each of the N paths in each case have a storage element for storage of one of the N look-up tables, wherein each storage element has
an address input which is driven as a function of the filter input signal, and
an output for emitting stored data values as a function of the signal at the address input, and
comprises a counter with n counts for the address input drive.

15. An I/Q modulator according to claim 14, wherein the I/Q modulator is used in a transmitter which complies with the Bluetooth 1.2 Standard or higher with an enhanced data rate or with the High Rate on the Bluetooth Standard.

16. A filter method having a finite impulse response, with the length of the impulse response corresponding at most to the duration of N input values, the method comprising:
emitting a filter output signal for a digital filter input signal, which filter output signal is n-times oversampled in comparison to the filter input signal, and
reading out a plurality of N stored look-up tables for filtering the digital filter input signal, with n data values being stored per value in each look-up table for a plurality of k possible values of the filter input signal, and each data value being characteristic for the product of
a coefficient of the impulse response and
a value of the input signal or a value which is dependent on this value of the input signal, and
forming the output signal from the data values
driving the input of each of N digital filter paths with the filter input signal or with a delayed filter input signal, and
each of the N paths in each case have a storage element for storage of one of the N stored look-up tables, wherein each storage element has
an address input which is driven as a function of the filter input signal, and
an output for emitting stored data values as a function of the signal at the address input, and
counting with a counter with n counts for the address input drive.

17. A filter method according to claim 16, wherein the filter method carries out filtering in the course of transmission-end pulse shaping.

18. A filter method according to claim 16, wherein the filter input signal represents the I or Q component of a signal—in particular in the form of (ceil(1d(k'))), where k describes the total number of possible values of the filter input signal—and each data value corresponds to the product:
of a coefficient of the impulse response and
of a value of I or Q component respectively.

19. A filter method according to claim 16, wherein only data value relating to values of the filter input signal other than 0 are stored in the look-up tables.

20. A filter method according to claim 16, wherein the filter method is a root raised cosine-based filter method.

21. A filter method according to claim 16, wherein the filter input signal has only 5 different values, in particular with the filter input signal describing the I or Q signal component for PSK modulation with 8 different complex symbol values on the unit circle.

22. A filter method according to claim 16, wherein the filter method is used for pulse shaping in a transmitter which complies with the Bluetooth 1.2 Standard or higher with an enhanced data rate or with the High Rate on the Bluetooth Standard.

23. An I/Q modulator, comprising
a first filter for pulse shaping of signals in the I path of the I/Q modulator, and
a second filter for pulse shaping of signals in the Q path of the I/Q modulator, wherein the first and second filter each are digital filters having a finite impulse response, with the length of the impulse response corresponding at most to the duration of N input values, wherein each digital filter:
receives a digital filter input signal and emits a filter output signal, which is n-times oversampled in comparison to the filter input signal, and
comprises a means for storage of a plurality N of look-up tables, with n data values being stored per value in each look-up table for a plurality of k possible values of the filter input signal, and each data value being characteristic for the product of
a coefficient of the impulse response and
a value of the input signal or a value which is dependent on this value of the input signal, wherein the output signal is formed from the data values
comprises N paths, with
the input of each of the N paths being driven by the filter input signal or by a delayed filter input signal, and
each of the N paths in each case have a storage element for storage of one of the N look-up tables, wherein each storage element has
an address input which is driven as a function of the filter input signal, and
an output for emitting stored data values as a function of the signal at the address input, wherein only data values for values of the filter input signal other than 0 are stored in the look-up tables, and wherein each path has a circuit means which decouples the output of a storage element from the output of the respective path when the value of the signal at the input of the respective path corresponds to 0.

24. A filter method having a finite impulse response, with the length of the impulse response corresponding at most to the duration of N input values, the method comprising:

emitting a filter output signal for a digital filter input signal, which filter output signal is n-times oversampled in comparison to the filter input signal, and reading out a plurality of N stored look-up tables for filtering the digital filter input signal, with n data values being stored per value in each look-up table for a plurality of k possible values of the filter input signal, and each data value being characteristic for the product of a coefficient of the impulse response and a value of the input signal or a value which is dependent on this value of the input signal, and forming the output signal from the data values driving the input of each of N digital filter paths with the filter input signal or by a delayed filter input signal, and each of the N paths in each case have a storage element for storage of one of the N look-up tables, wherein each storage element has an address input which is driven as a function of the filter input signal, and an output for emitting stored data values as a function of the signal at the address input, wherein only data values for values of the filter input signal other than 0 are stored in the look-up tables, and wherein each path has a circuit means which decouples the output of a storage element from the output of the respective path when the value of the signal at the input of the respective path corresponds to 0.

\* \* \* \* \*